United States Patent
Kim et al.

(10) Patent No.: US 9,966,407 B2
(45) Date of Patent: May 8, 2018

(54) UNIT PIXELS, IMAGE SENSORS INCLUDING THE SAME, AND IMAGE PROCESSING SYSTEMS INCLUDING THE SAME

(71) Applicant: Samsung Electronics Co., Ltd., Suwon-si, Gyeonggi-do (KR)

(72) Inventors: Young Chan Kim, Seongnam-si (KR); Jung Chak Ahn, Yongin-si (KR); Hyuk Soon Choi, Hwaseong-si (KR); Kyung Ho Lee, Suwon-si (KR); Jun Suk Lee, Seoul (KR); Young Woo Jung, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 186 days.

(21) Appl. No.: 14/830,805

(22) Filed: Aug. 20, 2015

(65) Prior Publication Data

US 2016/0056199 A1 Feb. 25, 2016

(30) Foreign Application Priority Data

Aug. 21, 2014 (KR) .................. 10-2014-0109181

(51) Int. Cl.
*H01L 27/14* (2006.01)
*H01L 27/146* (2006.01)
*H04N 5/3745* (2011.01)

(52) U.S. Cl.
CPC .... *H01L 27/14643* (2013.01); *H01L 27/1461* (2013.01); *H01L 27/1463* (2013.01); *H01L 27/1464* (2013.01); *H01L 27/14603* (2013.01); *H01L 27/14612* (2013.01); *H01L 27/14614* (2013.01); *H01L 27/14623* (2013.01); *H01L 27/14627* (2013.01); *H01L 27/14641* (2013.01); *H04N 5/37452* (2013.01); *H04N 5/37457* (2013.01)

(58) Field of Classification Search
CPC .......... H01L 27/14643; H01L 27/1464; H01L 27/14603; H01L 27/14627; H01L 27/14623; H01L 27/14612; H01L 27/14614; H01L 27/1461; H01L 27/14641; H01L 27/1463; H04N 5/37452; H04N 5/37457
See application file for complete search history.

(56) References Cited

U.S. PATENT DOCUMENTS

| | | | |
|---|---|---|---|
| 6,448,596 B1 | 9/2002 | Kawajiri et al. |
| 7,361,877 B2 | 4/2008 | McGrath et al. |
| 7,573,013 B2 | 8/2009 | Choi et al. |
| 7,830,437 B2 | 11/2010 | McKee et al. |
| 2008/0210986 A1 | 9/2008 | Mauritzson |

(Continued)

FOREIGN PATENT DOCUMENTS

| | | |
|---|---|---|
| JP | 2007-287891 | 11/2007 |
| KR | 101377063 B1 | 3/2014 |

*Primary Examiner* — Tony Ko
(74) *Attorney, Agent, or Firm* — Ward and Smith, P.A.

(57) ABSTRACT

A unit pixel of an image sensor which operates in global shutter mode is provided. The unit pixel includes a photo diode area including a photo diode configured to accumulate photocharges generated from incident light during a first period and a storage diode area including a storage diode configured to receive and store the photocharges from the photo diode. The photo diode corresponds to a micro lens that focuses the incident light.

20 Claims, 14 Drawing Sheets

(56) References Cited

U.S. PATENT DOCUMENTS

| | | |
|---|---|---|
| 2012/0273854 A1 | 11/2012 | Velichko et al. |
| 2013/0164877 A1 | 6/2013 | Anderson et al. |
| 2013/0258150 A1 | 10/2013 | Kanbe |
| 2014/0085517 A1 | 3/2014 | Lenchenkov et al. |
| 2014/0085523 A1 | 3/2014 | Hynecek |
| 2016/0049438 A1* | 2/2016 | Murata ............ H01L 27/14603 257/229 |

* cited by examiner

UNIT PIXELS, IMAGE SENSORS INCLUDING THE SAME, AND IMAGE PROCESSING SYSTEMS INCLUDING THE SAME

CROSS-REFERENCE TO RELATED APPLICATIONS

This application claims priority under 35 U.S.C. § 119(a) from Korean Patent Application No. 10-2014-0109181 filed on Aug. 21, 2014, the disclosure of which is hereby incorporated by reference in its entirety.

BACKGROUND

An image sensor is a device that converts an optical image into an electrical signal. The image sensor is used in digital cameras or other types of image processing devices. The image sensor includes a plurality of pixels. Mechanical shutter mode and electronic shutter mode are largely used to control an exposure time that determines the amount of photocharges that the electrical signal is based on.

The mechanical shutter mode is a method of blocking light to pixels using a mechanical device. The electronic shutter mode is usually used in complementary metal-oxide semiconductor (CMOS) image sensors. It is a method of electrically controlling an integration time during which photocharges are generated and accumulated. The electronic shutter mode includes rolling shutter mode and global shutter mode.

The rolling shutter mode is a method of controlling an integration time to be different for each row in a pixel array. The global shutter mode is a method of controlling an integration time to be the same throughout all rows in a pixel array.

The global shutter mode has an advantage of eliminating image distortion caused by different integration times among rows. However, it also has some disadvantages including a low degree of integration, and therefore, some improvements are desired.

SUMMARY

According to some embodiments of the inventive concept, there is provided a unit pixel of an image sensor which operates in global shutter mode. The unit pixel includes a photo diode area including a photo diode configured to accumulate photocharges generated from incident light during a first period; and a storage diode area including a storage diode configured to receive and store the photocharges that have been accumulated in the photo diode. The photo diode may correspond to a micro lens that focuses the incident light.

The photo diode area and the storage diode area may be arranged aslant with respect to either of a row direction and a column direction.

The unit pixel may further include an overflow gate configured to prevent photocharges generated during a period other than the first period from overflowing from the photo diode into the storage diode, a storage gate configured to transfer the photocharges accumulated at the photo diode to the storage diode, and a transfer gate configured to transfer the photocharges stored in the storage diode to a floating diffusion.

The overflow gate, the storage gate, the transfer gate, and the floating diffusion may be sequentially arranged in a line.

A voltage level of the floating diffusion may be sensed by an adjacent unit pixel.

The overflow gate, the storage gate, and the transfer gate may have a recess gate structure.

The unit pixel may further include a light shielding film which has an area corresponding to the storage diode area to block the incident light.

The unit pixel may further include a second deep trench isolation (DTI) formed between the photo diode and the storage diode to block the incident light.

The unit pixel may further include a first DTI formed at an edge of the unit pixel for electrical and optical isolation between the unit pixel and an adjacent unit pixel.

The unit pixel may share a signal output circuit with an adjacent unit pixel. The signal output circuit may include a reset transistor configured to reset a floating diffusion to which the store photocharges are transferred, a source follower configured to generate a current corresponding to a voltage level of the floating diffusion, and a select transistor configured to output the current as a pixel signal.

According to other embodiments of the inventive concept, there is provided an image sensor operating in global shutter mode. The image sensor includes a pixel array including a plurality of unit pixels each of which outputs a pixel signal corresponding to incident light received during a first period, a readout circuit configured to perform analog-to-digital conversion on the pixel signal to generate a digital pixel signal, and a timing generator configured to control the pixel array and the readout circuit. Each of the unit pixels includes a photo diode area including a photo diode configured to accumulate photocharges generated from the incident light during the first period; and a storage diode area including a storage diode configured to receive and store the photocharges that have been accumulated in the photo diode. The photo diode may correspond to a micro lens that focuses the incident light.

According to still other embodiments of the inventive concept, there is provided a unit pixel of an image sensor which operates in global shutter mode. The unit pixel includes a photo diode configured to accumulate photocharges generated from incident light during a first period, a storage diode configured to receive and store the photocharges that have been accumulated in the photo diode, and a light shielding unit configured to shield the storage diode from the incident light. The photo diode may correspond to a micro lens that focuses the incident light.

According to further embodiments of the inventive concept, there is provided an image processing system operating in global shutter mode. The image processing system includes an image sensor which includes a plurality of unit pixels each of which outputs a pixel signal corresponding to incident light received during a first period and which performs analog-to-digital conversion on the pixel signal to generate a digital pixel signal; and an image signal processor configured to process the digital pixel signal to generate image data. Each of the unit pixels includes a photo diode area including a photo diode configured to accumulate photocharges generated from the incident light during the first period; and a storage diode area including a storage diode configured to receive and store the photocharges that have been accumulated in the photo diode. The photo diode may correspond to a micro lens that focuses the incident light.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The above and other features and advantages of the inventive concept will become more apparent by describing in detail example embodiments thereof with reference to the attached drawings.

DETAILED DESCRIPTION OF THE EMBODIMENTS

Figure 1:
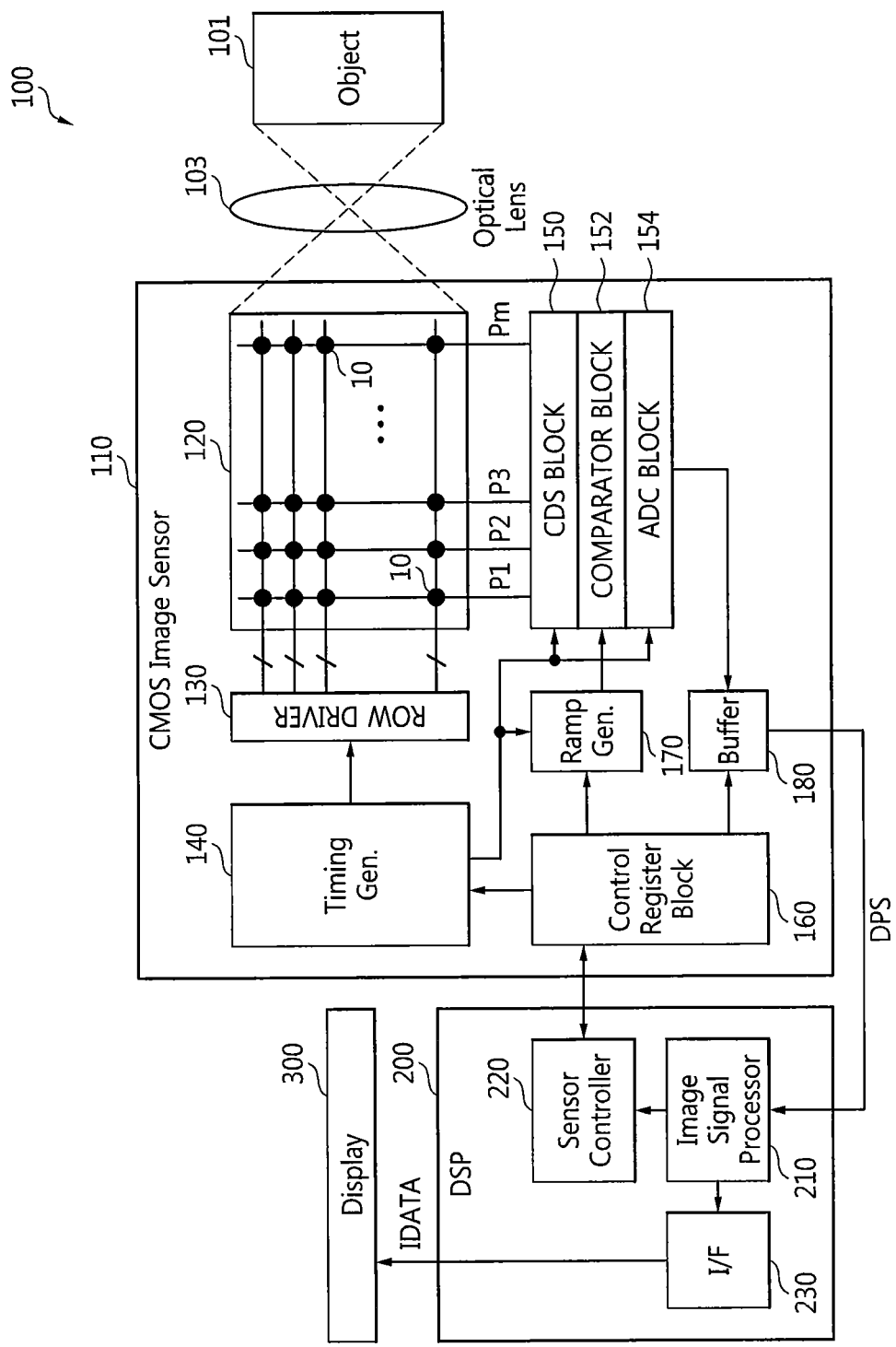
FIG. 1 is a block diagram of an image processing system according to some embodiments of the inventive concept.

The inventive concept now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of an image processing system 100 according to some embodiments of the inventive concept. The image processing system 100 may be implemented as a portable electronic device such as a laptop computer, a cellular phone, a smart phone, a tablet personal computer (PC), a personal digital assistant (PDA), an enterprise digital assistant (EDA), a digital still camera, a digital video camera, a portable multimedia player (PMP), a mobile internet device (MID), a wearable computer, an internet of things (IoT) device, and/or an internet of everything (IoE) device.

The image processing system 100 includes an optical lens 103, a complementary metal-oxide-semiconductor (CMOS) image sensor 110, a digital signal processor (DSP) 200, and a display 300. Some embodiments provide that the elements 110 and 200 may be implemented in a chip.

The CMOS image sensor 110 may generate digital pixel signals DPS corresponding to an object input (or captured) through the optical lens 103. The CMOS image sensor 110 includes a pixel (or active pixel sensor (APS)) array 120, a row driver 130, a timing generator 140, a correlated double sampling (CDS) block 150, a comparator block 152, an analog-to-digital conversion (ADC) block 154, a control register block 160, a ramp generator 170, and a buffer 180.

The CMOS image sensor 110 may be configured to be able to perform a global shutter operation. A global shutter operation may be a method of controlling an integration time while photodiodes (e.g., PD in FIG. 7) in the pixel array 120 accumulate photocharges to be uniform throughout all rows in the pixel array 120.

The pixel array 120 includes a plurality of pixels 10 arranged in a matrix. The structures and operations of the pixel array 120 and the pixels 10 will be described in detail with reference to FIGS. 2 through 12 later. Each of the pixels 10 may be referred to as a unit pixel in that the pixels 10 collectively form one pixel array 120.

The row driver 130 may transmit a plurality of control signals (OS, SS, TS, RS, and SLS in FIG. 7) for controlling the operation of the pixels 10 to the pixel array 120 according to the control of the timing generator 140. The control signals OS, SS, TS, RS, and SLS will be described in detail with reference to FIGS. 7, 8, 10, and 11 later.

The timing generator 140 may control the operations of the row driver 130, the CDS block 150, the ADC block 154, and the ramp generator 170 according to the control of the control register block 160.

The CDS block 150 performs CDS on pixel signals P1 through Pm output from respective column lines formed in the pixel array 120. The comparator block 152 compares pixel signals (e.g., voltage levels) that have been subjected to CDS in the CDS block 150 with a ramp signal output from the ramp generator 170 and outputs comparison signals according to the comparison result. The ADC block 154 converts the comparison signals received from the comparator block 152 into digital signals and outputs the digital signals to the buffer 180. In some embodiments, the CDS block 150, the comparator block 152, and the ADC block 154 may form a readout circuit.

The control register block 160 controls the operations of the timing generator 140, the ramp generator 170, and the buffer 180 according to the control of the DSP 200. The buffer 180 transmits the digital pixel signals DPS corresponding to the digital signals output from the ADC block 154 to the DSP 200. The DSP 200 includes an image signal processor 210, a sensor controller 220, and an interface 230.

The image signal processor 210 controls the interface 230 and the sensor controller 220 which controls the control register block 160. The image sensor 110 and the DSP 200 may be respectively implemented in chips in a single package, e.g., a multi-chip package. Some embodiments provide that the image sensor 110 and the image signal processor 210 may be respectively implemented in chips in a single package, e.g., a multi-chip package. In some embodiments, the image sensor 110 and the image signal processor 210 may be implemented together in a single chip.

The image signal processor 210 processes the digital pixel signals DPS received from the buffer 180 and transmits processed image data IDATA to the interface 230. The sensor controller 220 generates various control signals for controlling the control register block 160 according to the control of the image signal processor 210. The interface 230 transmits the processed image data IDATA from the image signal processor 210 to the display 300.

The display 300 displays the image data IDATA output from the interface 230. The display 300 may be a thin film transistor-liquid crystal display (TFT-LCD), a light emitting diode (LED) display, an organic LED (OLED) display, and/or an active-matrix OLED (AMOLED) display.

Figure 2:
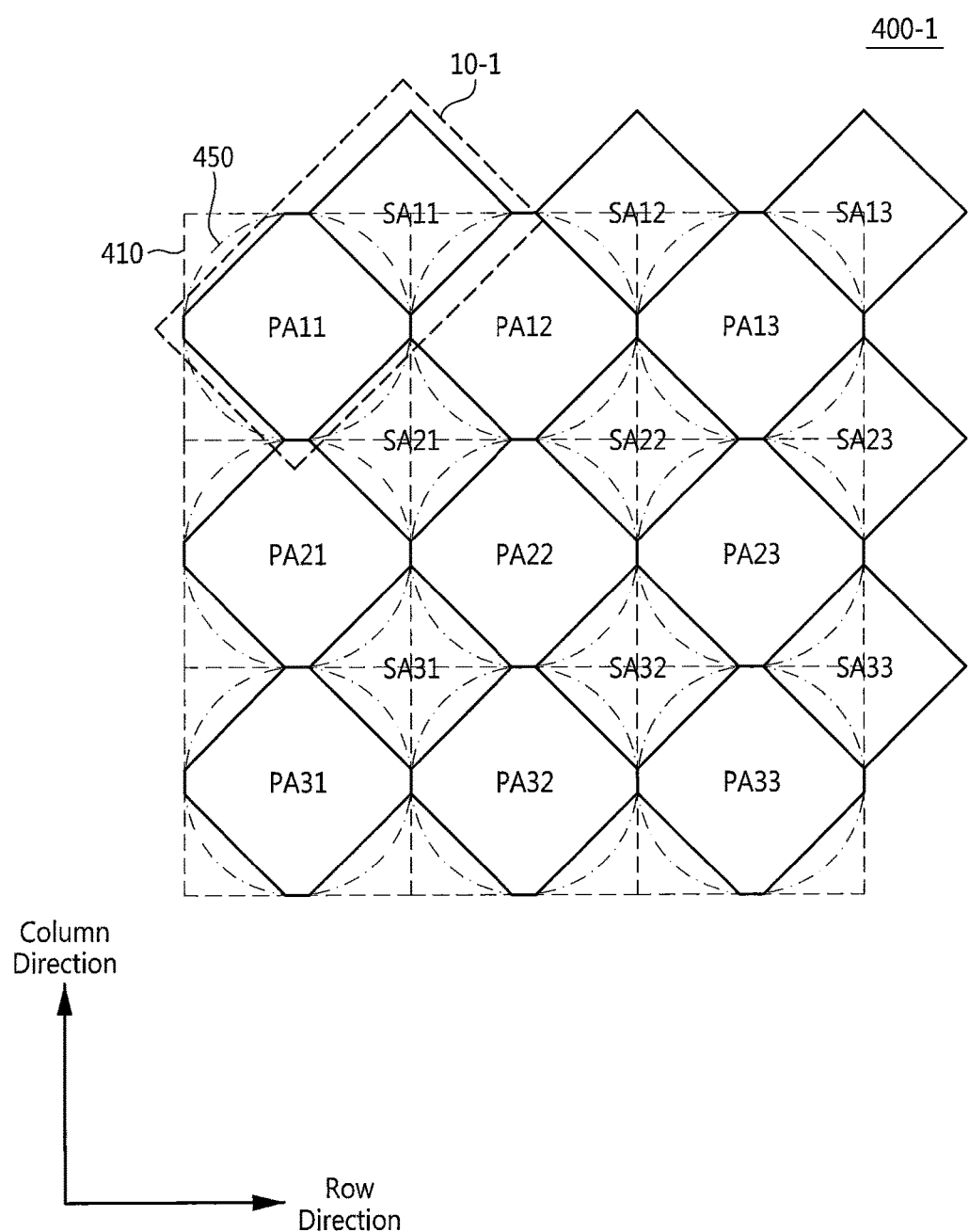
FIG. 2 is a diagram of an example of a pixel array illustrated in FIG. 1.
Figure 3:
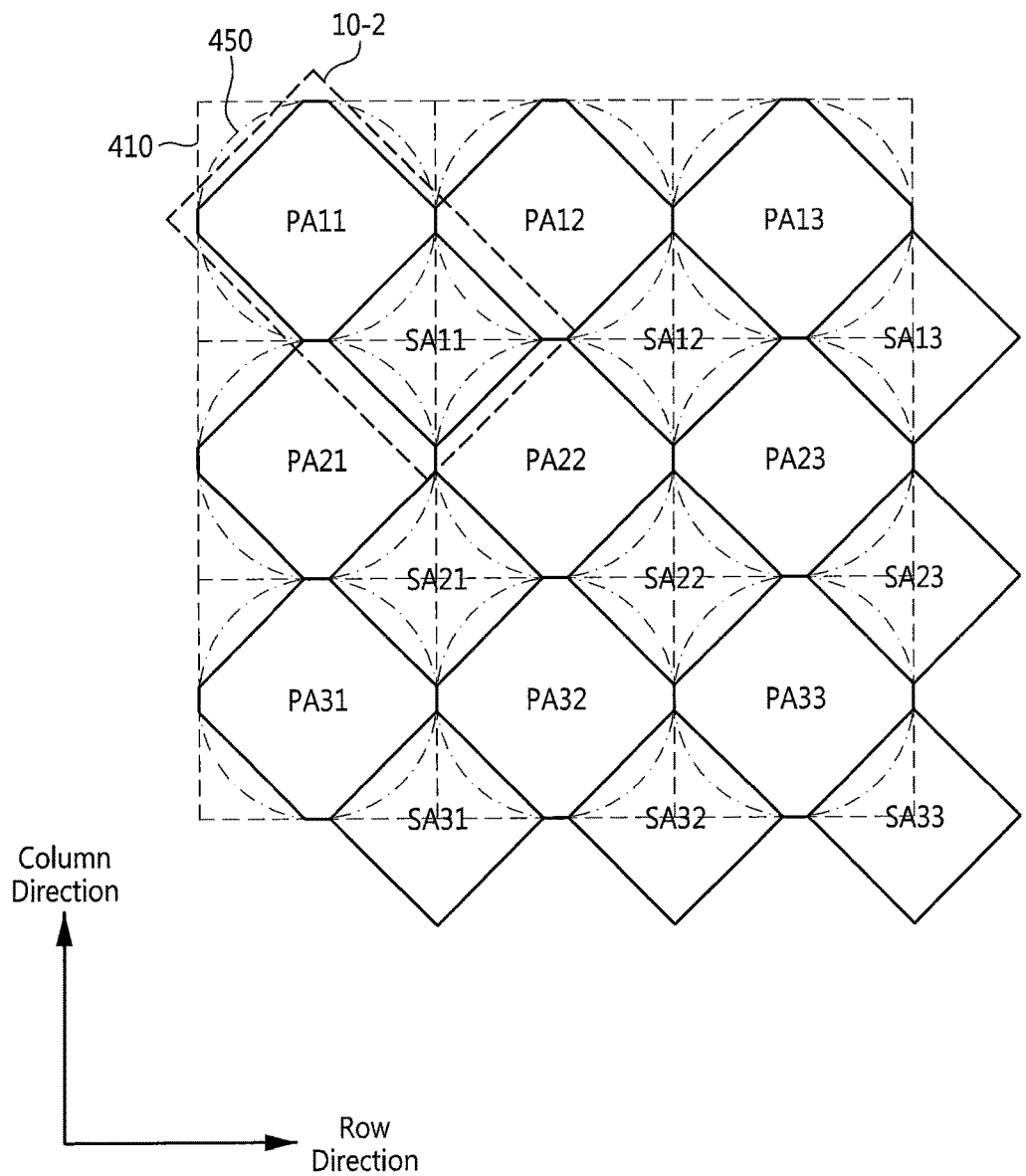
FIG. 3 is a diagram of another example of the pixel array illustrated in FIG. 1.
Figure 4:
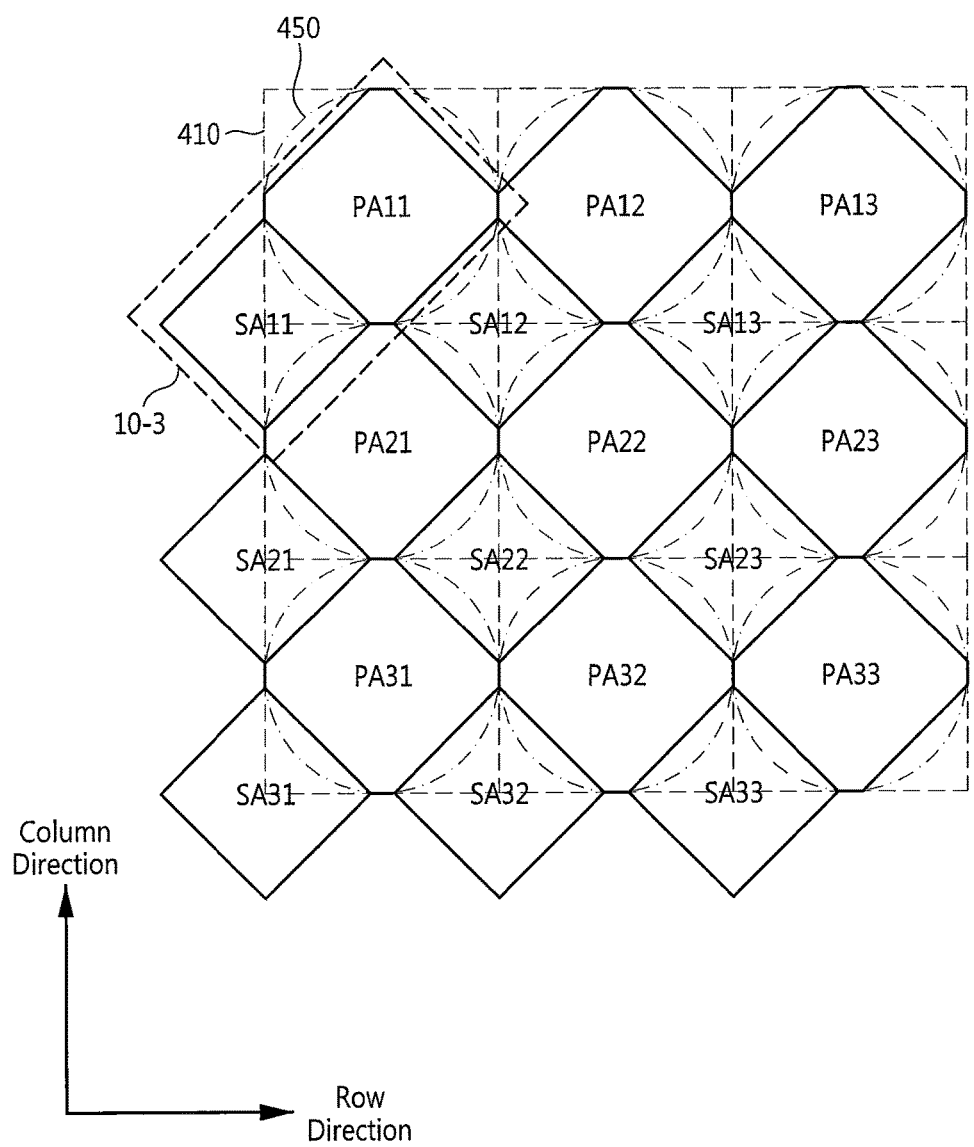
FIG. 4 is a diagram of still another example of the pixel array illustrated in FIG. 1.
Figure 5:
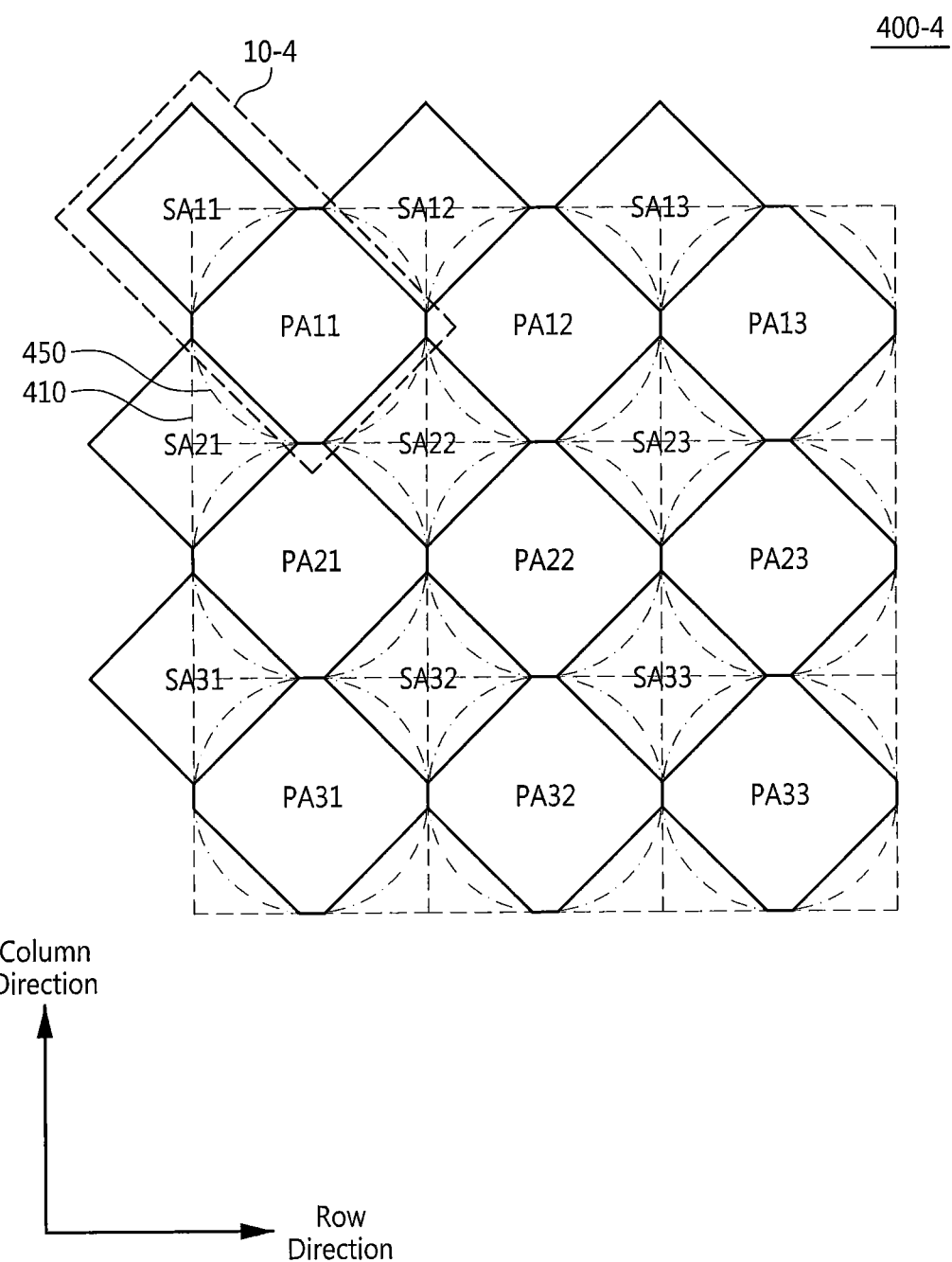
FIG. 5 is a diagram of a further example of the pixel array illustrated in FIG. 1.

FIG. 2 is a diagram of an example 400-1 of the pixel array 120 illustrated in FIG. 1. FIG. 3 is a diagram of another example 400-2 of the pixel array 120 illustrated in FIG. 1. FIG. 4 is a diagram of still another example 400-3 of the pixel array 120 illustrated in FIG. 1. FIG. 5 is a diagram of a further example 400-4 of the pixel array 120 illustrated in FIG. 1.

Referring to FIGS. 1 and 2, it is assumed that the pixel array 120 illustrated in FIG. 1 includes only nine pixels 10-1 arranged in a 3×3 matrix with three rows and three columns in the example 400-1. For convenience of description, it is described that the pixel array 120 includes nine pixels 10-1, but inventive concept is not restricted to this example. The pixel array 120 may have an n×m matrix format, where "n" and "m" are integer of at least 1.

The 3×3 pixel regions 410 are arranged in parallel or vertical to a row direction and a column direction. Each pixel region 410 may include a micro lens 450 that focuses incident light coming through an optical lens 103 on the center of the pixel region 410.

The pixels 10-1 may include photo diode areas PA11 through PA33, respectively, and storage diode areas SA11 through SA33, respectively. For instance, a pixel 10-1 at the intersection between a second row and a second column includes the photo diode area PA22 and the storage diode area SA22.

The photo diode areas PA11 through PA33 may include a photo diode (e.g., PD in FIG. 7) that accumulates photocharges generated from incident light. A photo diode (e.g., PD in FIG. 7) may occupy most of each of the photo diode areas PA11 through PA33. The center of each of the photo diode areas PA11 through PA33 may coincide with the center of the pixel region 410, so that the micro lens 450 focuses incident light on the photo diode (e.g., PD in FIG. 7) of each of the photo diode areas PA11 through PA33.

The storage diode areas SA11 through SA33 may include a storage diode (e.g., SD in FIG. 7) that temporarily stores photocharges accumulated at a photo diode (e.g., PD in FIG. 7) in order to realize global shutter mode. The storage diode areas SA11 through SA33 may be formed at an angle of 45 degrees with respect to the photo diode areas PA11 through PA33, respectively. A storage diode (e.g., SD in FIG. 7) may occupy most of each of the storage diode areas SA11 through SA33.

Each storage diode area, e.g., SA22 may be arranged adjacent a photo diode area, e.g., PA22 included in the same pixel 10-1 as the storage diode area SA22. The photo diode area PA22 and the storage diode area SA22 may be arranged aslant with respect to the row direction and/or the column direction. For instance, the photo diode area PA22 and the storage diode area SA22 may be arranged at an angle of 45 degrees with respect to the row direction and/or the column direction.

Figure 7:
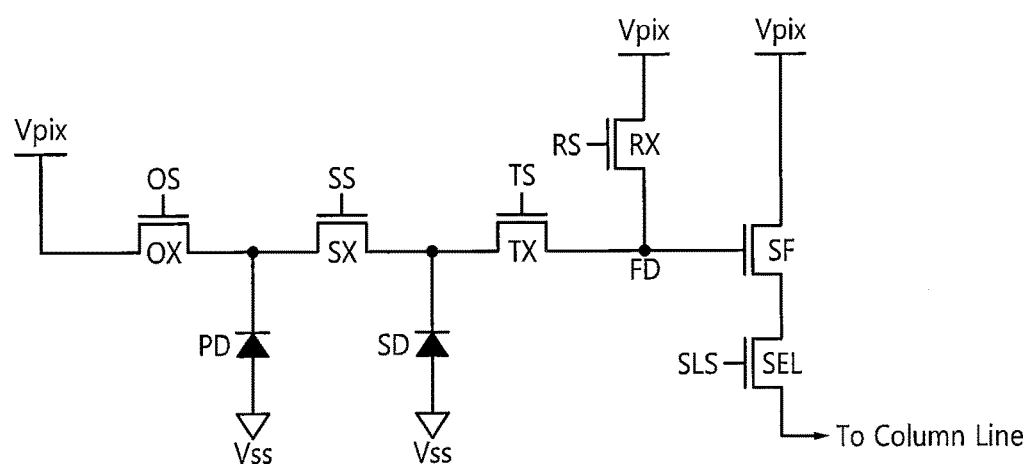
FIG. 7 is a circuit diagram of a pixel illustrated in FIG. 6.

The micro lens 450 may be formed to correspond to a photo diode (e.g., PD in FIG. 7). Here, "corresponding to" may mean that the micro lens 450 has an area matching an area of the photo diode PD and is formed to overlap most of the area of the photo diode PD. Meanwhile, the micro lens 450 may be formed not to correspond to a storage diode (e.g., SD in FIG. 7). In other words, the micro lens 450 may have an area which does not match an area of the storage diode SD and may be formed not to overlap most of the area of the storage diode SD. This means that when micro lenses 450 are placed in the pixel regions 410, a storage diode area, e.g., SA21 may be arranged among adjacent micro lenses 450, for example, corresponding to the photo diode areas PA11, PA12, PA21, and PA22.

Consequently, the photo diode areas PA11 through PA33 are formed to correspond to the respective micro lenses 450 as much as possible and the storage diode areas SA11 through SA33 are formed in an area except for the photo diode areas PA11 through PA33. As a result, the arrangement efficiency or the degree of integration of the pixels 10-1 may be increased.

In addition, since the micro lenses 450 are formed to correspond to the photo diode areas PA11 through PA33 only without the storage diode areas SA11 through SA33, light absorptance is increased and light leakage is decreased. The light absorptance may be the amount of light that can be absorbed per unit area. The light leakage may be a phenomenon in which noise occurs in the pixel signals P1 through Pm because a storage diode SD supposed to store photocharges only generated by a photo diode PD stores other photocharges (e.g., photocharges generated from light incident on the storage diode SD).

Unlike the example 400-1 illustrated in FIG. 2, in the examples 400-2, 400-3, and 400-4 respectively illustrated in FIGS. 3 through 5, the storage diode areas SA11 through SA33 included in the pixels 10-2 may be formed at an angle of 135 degrees with respect to the photo diode areas PA11 through PA33, respectively; the storage diode areas SA11 through SA33 included in the pixels 10-3 may be formed at an angle of 225 degrees with respect to the photo diode areas PA11 through PA33, respectively; and the storage diode areas SA11 through SA33 included in the pixels 10-4 may be formed at an angle of 315 degrees with respect to the photo diode areas PA11 through PA33, respectively. The structure and operations of each of the pixels 10-2, 10-3, and 10-4 in the examples 400-2, 400-3, and 400-4 of the pixel array 120 are substantially the same as those of the pixel 10-1 in the example 400-1.

Figure 6:
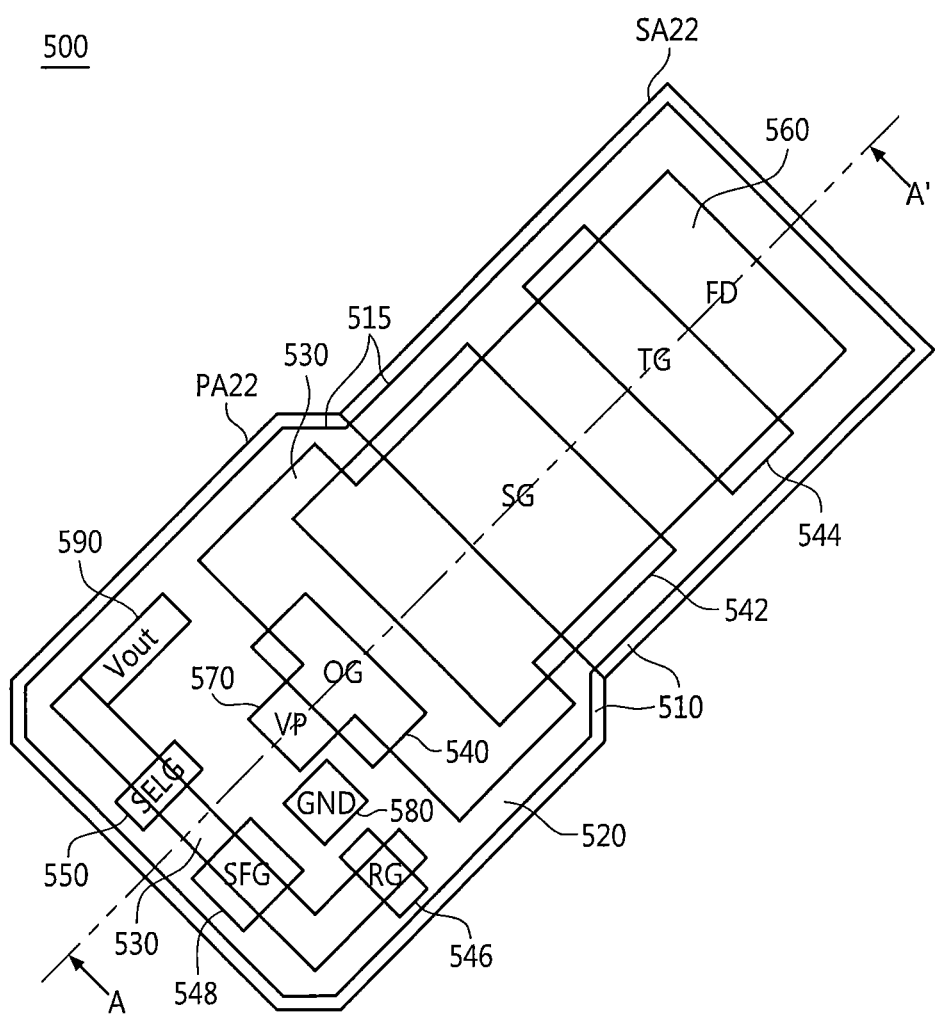
FIG. 6 is a diagram of a layout of a pixel illustrated in FIG. 2 according to some embodiments of the inventive concept.
Figure 8:
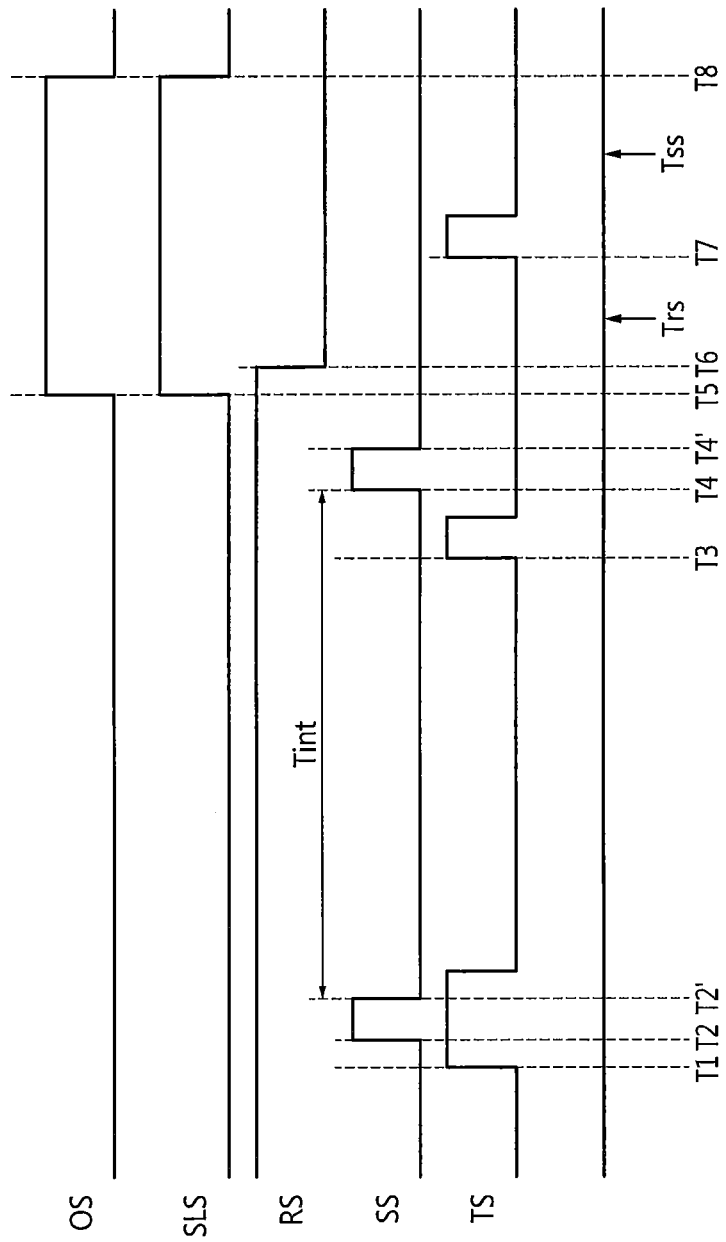
FIG. 8 is a timing chart showing the operation of the pixel illustrated in FIG. 7.

FIG. 6 is a diagram of a layout 500 of a pixel 10-1 illustrated in FIG. 2 according to some embodiments of the inventive concept. FIG. 7 is a circuit diagram of a pixel illustrated in FIG. 6. FIG. 8 is a timing chart showing the operation of the pixel illustrated in FIG. 7.

Referring to FIGS. 1 through 8, the layout 500 is a layout of the pixel 10-1 positioned at the intersection between the second row and the second column among the pixels 10-1 illustrated in FIG. 2. Although the layout 500 of only the pixel 10-1 illustrated in FIG. 2 will be described, a layout (not shown) of the pixels 10-2, 10-3, and 10-4 illustrated in FIGS. 3 through 5 is the same as the layout 500 except for a direction.

The layout 500 shows the arrangement of elements included in the pixel 10-1. The layout 500 may include the photo diode area PA22 and the storage diode area SA22. The photo diode area PA22 and the storage diode area SA22 may include a deep trench isolation (DTI) region 510 and an active region 515.

The DTI region 510 may be formed at the edge of the active region 515 for electrical or optical isolation from an active region (not shown) of an adjacent pixel (not shown). The DTI region 510 formed using a DTI process may be filled with oxide such as hafnium oxide and/or polysilicon. For instance, the DTI region 510 may be formed of a polysilicon film doped with boron with high reflectance, but the inventive concept is not restricted to this example.

The DTI region 510 may prevent electric crosstalk which causes a signal-to-noise ratio (SNR) to decrease due to exchange of carriers between active regions. In addition, sidewalls of the DTI region 510 are doped with a material with high light reflectance, thereby preventing optical crosstalk which causes an SNR to decrease because light incident on the active region 515 penetrates an adjacent active region (not shown). For instance, the sidewalls of the DTI region 510 may be formed of a polysilicon film doped with boron having high reflectance, but the inventive concept is not restricted to this example.

The active region 515 may include a shallow trench isolation (STI) 520, a well 530, a gate (OG) 540 of an overflow transistor OX, a gate (SG) 542 of a storage transistor SX, a gate (TG) 544 of a transfer transistor TX, a gate (RG) 546 of a reset transistor RX, a gate (SFG) 548 of a source follower SF, a gate (SELG) 550 of a select transistor SEL, a floating diffusion 560, a pixel voltage terminal (VP) 570, a ground terminal (GND) 580, and an output terminal 590. The arrangement of elements included in the active region 515 is not restricted to that illustrated in FIG. 6 but may be modified freely.

The STI 520 may be formed around the other elements in the inside of the DTI region 510. The STI 520 may be formed using an STI process to electrically isolate the elements. The STI 520 may shallower than the DTI region 510. The inside of the STI 520 may be formed of substantially the same material as the DTI region 510.

The well area 530 is doped with p- or n-type impurities. It may be formed to electrically isolate elements from one another. A region highly doped with impurities (e.g., p++ or n++ impurities) may be formed in the well area 530. This highly doped region may function as a source terminal and/or drain terminal of each of the overflow transistor OX, the storage transistor SX, the transfer transistor TX, the reset transistor RX, the source follower SF, and the select transistor SEL. The well area 530 may electrically insulate the highly doped region.

The gate 540 of the overflow transistor OX, the gate 542 of the storage transistor SX, the gate 544 of the transfer transistor TX, the gate 546 of the reset transistor RX, the gate 548 of the source follower SF, and the gate 550 of the select transistor SEL may respectively receive the control signals OS, SS, TS, RS, and SLS, which will be described with reference to FIG. 7 later. The gate 548 of the source follower SF may be connected to the floating diffusion 560. The gates 540, 542, 544, 546, 548 and 550 may be formed of polysilicon.

The gate 540 of the overflow transistor OX, the gate 542 of the storage transistor SX, the gate 544 of the transfer transistor TX, and the floating diffusion 560 may be sequentially arranged in a line. As shown in FIG. 7, photocharges accumulated at the photo diode PD are transferred sequentially from the photo diode PD to the storage diode SD and to a floating diffusion FD.

The shorter the length of a channel among the photo diode PD, the storage diode SD, and the floating diffusion FD and the wider the channel, the higher the transfer efficiency of the photocharges. Accordingly, in order to maximize the transfer efficiency of photocharges among the photo diode PD, the storage diode SD, and the floating diffusion FD, the elements 540, 542, 544, and 560 may be sequentially arranged in a line, as shown in FIG. 6.

The transfer of charges among the photo diode PD, the storage diode SD, and the floating diffusion FD may be carried out in a very short section. Therefore, when the transfer efficiency is not satisfactory, photocharges accumulated at the photo diode PD may not all transferred to the floating diffusion FD. This may cause noise in the pixel signals P1 through Pm.

The floating diffusion 560 may be formed adjacent the gate 544 of the transfer transistor TX. Photocharges generated in the photo diode PD are transferred through the storage transistor SX and the transfer transistor TX and accumulated at the floating diffusion 560. The floating diffusion 560 may be connected to the gate 548 of the source follower SF. The voltage level of the floating diffusion 560 may be sensed by the source follower SF and the source follower SF may transmit a current corresponding to the voltage level to the select transistor SEL.

In some embodiments, the floating diffusion 560 may be connected to a gate (not shown) of a source follower of another pixel (e.g., a pixel including the photo diode area PA13 and the storage diode area SA13) adjacent the layout 500 instead of the gate 548 of the source follower SF. At this time, the voltage level of the floating diffusion 560 may be sensed by a source follower (not shown) included in the photo diode area PA13 and the source follower may transfer a current corresponding to the voltage level to a select transistor (not shown) included in the photo diode area PA13. Here, the adjacent pixel may be any pixel in a different row than the layout 500.

The pixel voltage terminal 570 may supply a pixel voltage Vpix necessary for the operation of the pixel 10-2 corresponding to the layout 500. For instance, the pixel voltage terminal (VP) 570 may apply the pixel voltage Vpix to the drain terminal of each of the overflow transistor OX, the reset transistor RX, and the source follower SF. The pixel voltage Vpix may be equal to or lower than a power supply voltage VDD, but the inventive concept is not restricted to this example.

The ground terminal 580 may supply a ground voltage VSS necessary for the operation of the pixel 10-1 corresponding to the layout 500. For instance, the ground terminal 580 may apply the ground voltage VSS to one end of each of the photo diode PD and the storage diode SD. The output terminal 590 may be connected to the source terminal of the storage transistor SX to output a pixel signal from the source terminal to a column line.

The cross section of the layout 500 taken along the line A-A' in FIG. 6 will be described with reference to FIG. 12 later.

Referring to FIG. 7, a pixel 550 which corresponds to the layout 500 and is able to operate in global shutter mode includes the photo diode PD, the overflow transistor OX, the storage transistor SX, the transfer transistor TX, the reset transistor RX, the source follower SF, and the select transistor SEL.

The photo diode PD accumulates or collects photocharges generated in response to incident light. The overflow transistor OX is connected between the pixel voltage terminal VP supplying the pixel voltage Vpix and the photo diode PD. The gate OG of the overflow transistor OX is used to prevent charges generated by the photo diode PD from overflowing into the storage diode SD. The overflow transistor OX is turned on or off in response to the overflow control signal OS.

For instance, when the intensity of light incident on the pixel 550 is high (e.g., when the sun or a light is shot, that is, in case of a white level) or when photocharges generated during a time other than an integration time Tint are collected at the photo diode PD, the overflow transistor OX is used to prevent photocharges (e.g., electrons) generated in the photo diode PD from overflowing into the storage diode SD.

The storage transistor SX is connected between the photo diode PD and the storage diode SD. Charges transferred from the photo diode PD are stored in the storage diode SD through the storage transistor SX. The storage transistor SX is turned on or off in response to the storage control signal SS applied to its gate SG.

The transfer transistor TX is connected between the storage diode SD and the floating diffusion FD. Charges stored in the storage diode SD are stored or accumulated in the floating diffusion FD through the transfer transistor TX. The transfer transistor TX is turned on or off in response to the transfer control signal TS applied its gate TG.

The reset transistor RX is connected between the pixel voltage terminal VP supplying the pixel voltage Vpix and the floating diffusion FD. The reset transistor RX may transmit photocharges (e.g., electrons) from the floating diffusion FD to the pixel voltage terminal VP in response to the reset control signal RS. In other words, when the reset transistor RX is turned on, the voltage level of the floating diffusion FD may be reset to the pixel voltage Vpix.

The source follower SF is connected between the pixel voltage terminal VP supplying the pixel voltage Vpix and the select transistor SEL. The source follower SF operates based on a voltage level determined by charges in the floating diffusion FD.

The pixel voltage Vpix is applied in common to the overflow transistor OX, the reset transistor RX, and the source follower SF in the embodiments illustrated in FIGS. 6 and 7, for convenience' sake in the description. However, operating voltages respectively applied to the overflow transistor OX, the reset transistor RX, and the source follower SF may be designed differently.

The select transistor SEL may output an output signal (e.g., an analog pixel signal) of the source follower SF to a column line in response to the selection control signal SLS.

The operation of the pixel 550 according to the control signals OS, RS, SS, TS, and SLS illustrated in FIG. 7 will be described with reference to FIG. 8. The transfer control signal TS transits to a high level at a time point T1. Since the reset control signal RS is at a high level at the time point T1, charges (e.g., electrons) stored in the storage diode SD are discharged to the pixel voltage terminal VP through the reset transistor RX. The storage control signal SS transits to a high level at a time point T2. Accordingly, charges stored in the photo diode PD are discharged to the pixel voltage terminal VP through the transistors SX, TX, and RX.

The transfer control signal TS transits to the high level at a time point T3. Accordingly, charges (e.g., electrons) stored in the storage diode SD are discharged to the pixel voltage terminal VP through the reset transistor RX. The photo diode PD accumulates charges using incident light during the integration time Tint from a time point T2' to a time point T4 or during a first period.

The storage control signal SS transits to the high level at the time point T4. Accordingly, the charges in the photo diode PD are stored in the storage diode SD through the storage transistor SX.

The selection control signal SLS and the overflow control signal OS transit to a high level at a time point T5. As the overflow control signal OS transits to the high level, charges of the photo diode PD are discharged to the pixel voltage terminal VP. As a result, the charges of the photo diode PD do not overflow into the storage diode SD.

In some embodiments, the overflow control signal OS may transit to the high level not at the time point T5 but at a time point between time points T4' and T5. In some embodiments, the overflow control signal OS may transit to the high level in a random period of the integration time Tint at the high intensity of light incident on the pixel 550 (i.e., at the white level).

The reset control signal RS transits to a low level at a time point T6. Sampling of a reset signal is performed a time point Trs. The reset signal may be a pixel signal output according to the voltage level of the floating diffusion FD right after the floating diffusion FD is reset. The sampling of the reset signal may be performed by the CDS block 150 and the comparator block 152.

The transfer control signal TS transits to the high level at a time point T7. Accordingly, charges stored in the storage diode SD are stored in the floating diffusion FD.

Sampling of an image signal is performed at a time point Tss. The image signal may be a pixel signal output according to the voltage level of the floating diffusion FD right after transfer of charges from the storage diode SD to the floating diffusion FD is completed. The sampling of the image signal may be performed by the CDS block 150 and the comparator block 152.

When the selection control signal SLS transits to a low level at a time point T8, a sampling operation on the floating diffusion FD is completed.

Figure 9:
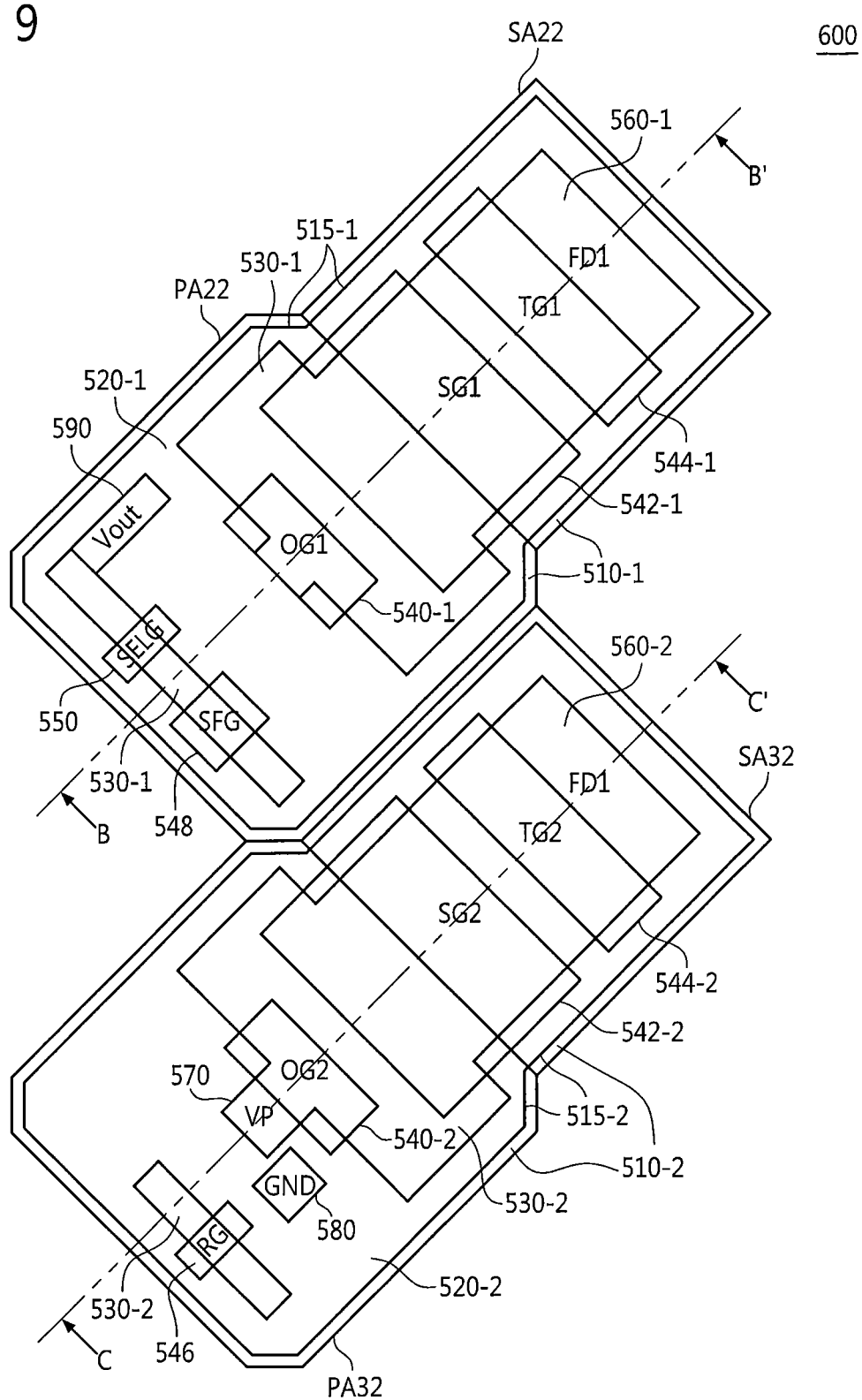
FIG. 9 is a diagram of a layout of pixels illustrated in FIG. 2 according to some embodiments of the inventive concept.
Figure 10:
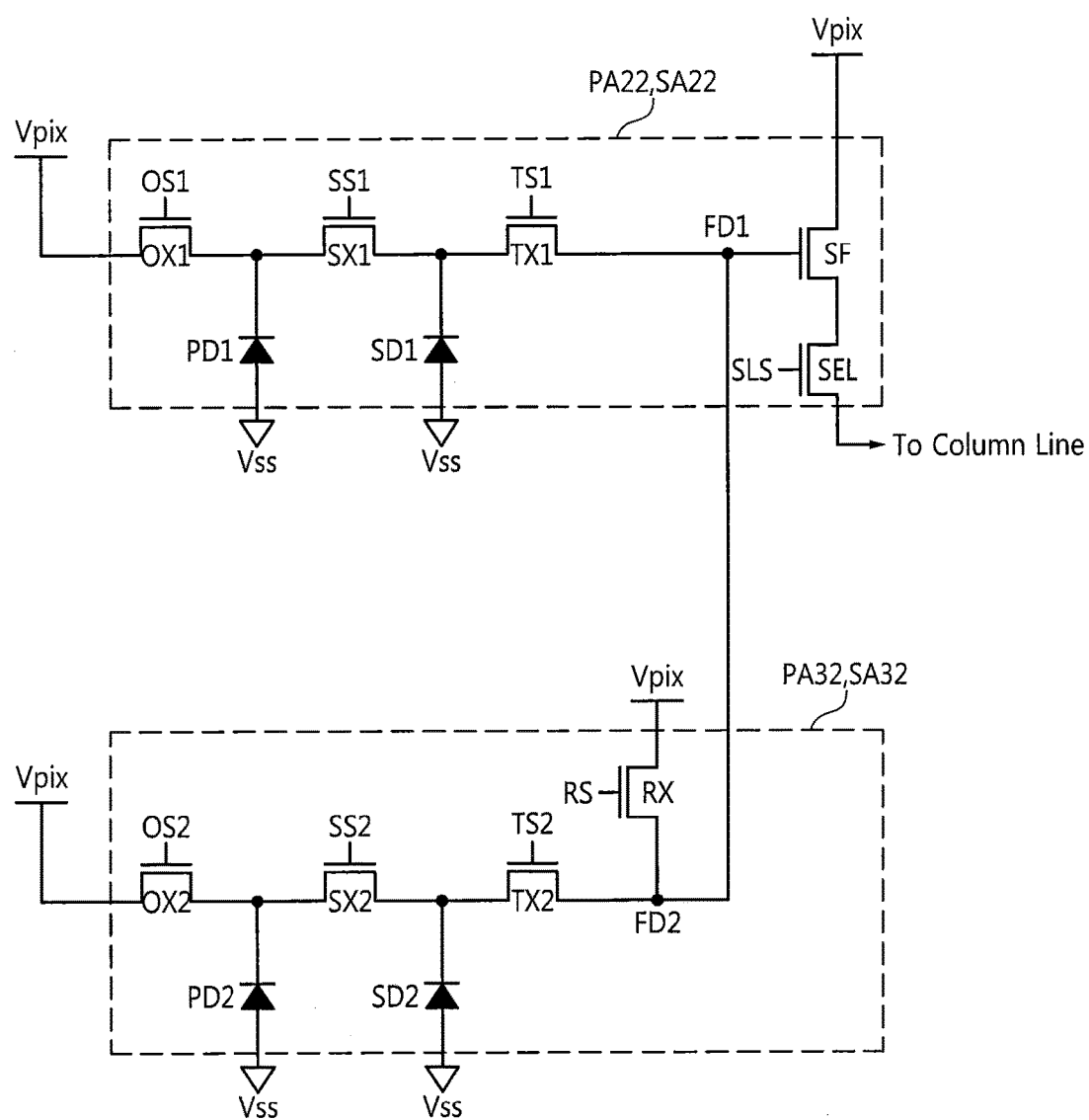
FIG. 10 is a circuit diagram of a pixel illustrated in FIG. 9.
Figure 11:
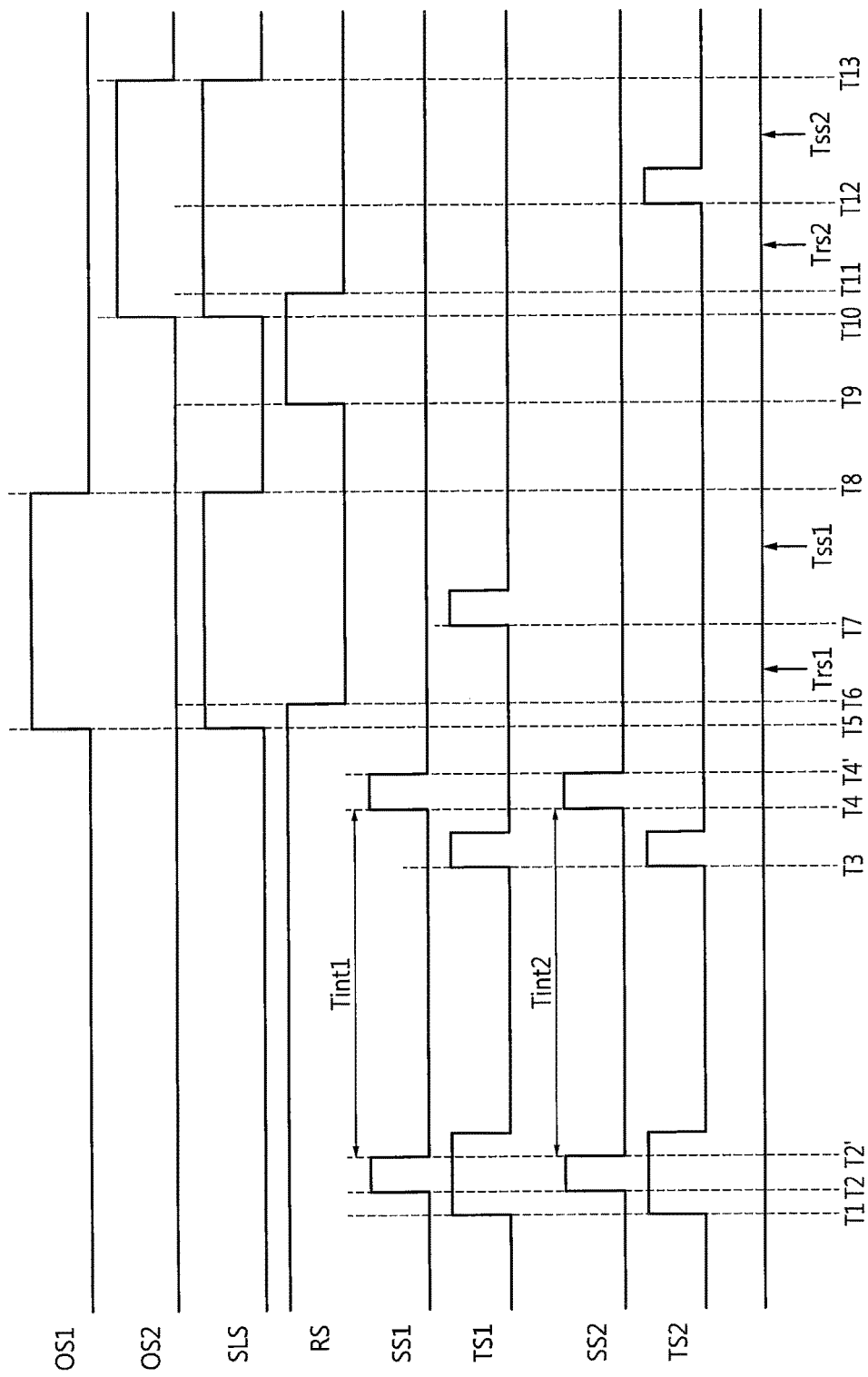
FIG. 11 is a timing chart showing the operation of the pixels illustrated in FIG. 10.

FIG. 9 is a diagram of a layout 600 of pixels 10-1 illustrated in FIG. 2 according to some embodiments of the inventive concept. FIG. 10 is a circuit diagram of a pixel illustrated in FIG. 9. FIG. 11 is a timing chart showing the operation of the pixel illustrated in FIG. 10.

Referring to FIGS. 1 through 11, the layout 600 is a layout of the pixel 10-1 positioned at the intersection between the second row and the second column and the pixel 10-1 positioned at the intersection between the third row and the second column among the pixels 10-1 illustrated in FIG. 2. Although the layout 600 of the pixels 10-1 illustrated in FIG. 2 will be described, a layout (not shown) of the pixels 10-2, 10-3, and 10-4 illustrated in FIGS. 3 through 5 is the same as the layout 600 except for a direction.

The layout 600 shows the arrangement of elements included in the pixels 10-1. The layout 600 may include the photo diode areas PA22 and PA32 and the storage diode areas SA22 and SA32. The photo diode area PA22 and the storage diode area SA22 may include a DTI region 510-1 and an active region 515-1. The photo diode area PA32 and the storage diode area SA32 may include a DTI region 510-2 and an active region 515-2.

Elements 520-1, 530-1, 540-1, 542-1, 544-1, and 560-1 included in the photo diode area PA22 and the storage diode area SA22 and elements 520-2, 530-2, 540-2, 542-2, 544-2, and 560-2 included in the photo diode area PA32 and the storage diode area SA32 are substantially the same as those 520, 530, 540, 542, 544, and 560 illustrated in FIG. 6.

A floating diffusion FD1 of the storage diode area SA22 may be electrically connected to a floating diffusion FD2 of the storage diode area SA32. However, unlike in the layout 500 illustrated in FIG. 6, the gate 546 of the reset transistor RX, the gate 548 of the source follower SF, the gate 550 of the select transistor SEL, the pixel voltage terminal 570, the ground terminal 580, and the output terminal 590 may be deployed across the photo diode areas PA22 and PA32 in a distributed fashion in the layout 600. In other words, each of the elements 546, 548, 550, 570, 580, and 590 may be shared by the photo diode areas PA22 and PA32 included in different pixels (e.g., two pixels in different rows).

The photo diode area PA22 includes some elements 548, 550, and 590 and the photo diode area PA32 includes the remaining elements 546, 570, and 580 in the embodiments illustrated in FIG. 9, but the inventive concept is not restricted to the current embodiments. In other words, which of the elements 546, 548, 550, 570, 580, and 590 is included to the photo diode area PA22 and which of the elements 546, 548, 550, 570, 580, and 590 is included to the photo diode area PA32 may be randomly determined as long as each of the elements 546, 548, 550, 570, 580, and 590 is included any one of the photo diode areas PA22 and PA32.

Since each of the elements 546, 548, 550, 570, 580, and 590 is shared by the photo diode areas PA22 and PA32 respectively included in different pixels, the area of each pixel 10-1 may be reduced and the degree of integration of the pixel array 120 may be increased.

Referring to FIG. 10, a pixel 650 which corresponds to the layout 600 and is able to operate in global shutter mode includes photo diodes PD1 and PD2, overflow transistors OX1 and OX2, storage transistors SX1 and SX2, transfer transistors TX1 and TX2, the reset transistor RX, the source follower SF, and the select transistor SEL. The photo diodes PD1 and PD2, the overflow transistors OX1 and OX2, the storage transistors SX1 and SX2, and the transfer transistors TX1 and TX2 perform substantially the same operations as the photo diode PD, the overflow transistor OX, the storage transistor SX, and the transfer transistor TX illustrated in FIG. 7.

As described with reference to FIG. 9, the reset transistor RX, the source follower SF, and the select transistor SEL may be deployed across the photo diode areas PA22 and PA32 in a distributed fashion and perform substantially the same operations as the reset transistor RX, the source follower SF, and the select transistor SEL illustrated in FIG. 7. However, since the reset transistor RX, the source follower SF, and the select transistor SEL are shared by the photo diode areas PA22 and PA32, the reset and sampling operations on the floating diffusions FD1 and FD2 may be performed by the reset transistor RX, the source follower SF, and the select transistor SEL. The reset transistor RX, the source follower SF, and the select transistor SEL may form a signal output circuit.

The operation of the pixel 650 according to control signals OS1, OS2, SLS, RS, SS1, TS1, SS2, and TS2 illustrated in FIG. 10 will be described with reference to FIG. 11. The transfer control signals TS1 and TS2 transit to a high level at the time point T1. Since the reset control signal RS is at the high level at the time point T1, charges (e.g., electrons) stored in the storage diodes SD1 and SD2 are discharged to the pixel voltage terminal VP through the reset transistor RX. The storage control signals SS1 and SS2 transit to the high level at the time point T2. Accordingly, charges stored in the photo diode PD1 are discharged to the pixel voltage terminal VP through the transistors SX1, TX1, and RX and charges stored in the photo diode PD2 are discharged to the pixel voltage terminal VP through the transistors SX2, TX2, and RX2.

The transfer control signals TS1 and TS2 transit to the high level at the time point T3. Accordingly, charges (e.g., electrons) stored in the storage diodes SD1 and SD2 are discharged to the pixel voltage terminal VP through the reset transistor RX. The photo diodes PD1 and PD2 generate charges using incident light during an integration time Tint1 or Tint2 between the time points T2' and T4 or during a second period.

The storage control signals SS1 and SS2 transit to the high level at the time point T4. Accordingly, the charges in the photo diodes PD1 and PD2 are stored in the storage diodes SD1 and SD2, respectively, through the storage transistors SX1 and SX2, respectively.

The selection control signal SLS and the overflow control signal OS1 transit to the high level at the time point T5. As the overflow control signal OS1 transits to the high level, charges of the photo diode PD1 are discharged to the pixel voltage terminal VP. As a result, the charges of the photo diode PD1 do not overflow into the storage diode SD1.

In some embodiments, the overflow control signal OS1 may transit to the high level not at the time point T5, but instead at a time point between the time points T4' and T5. In further embodiments, the overflow control signal OS1 may transit to the high level in a random period of the integration time Tint1 at the high intensity of light incident on the pixel 650 (i.e., at the white level).

The reset control signal RS transits to the low level at the time point T6. Sampling of a reset signal is performed a time point Trs1.

The transfer control signal TS1 transits to the high level at the time point T7. Accordingly, charges stored in the storage diode SD1 are stored in the floating diffusion FD1. Sampling of an image signal is performed at a time point Tss1.

When the selection control signal SLS transits to the low level at the time point T8, a sampling operation on the floating diffusion FD1 is completed.

When the reset control signal RS transits to the high level at a time point T9, charges stored in the floating diffusion FD2 are discharged to the pixel voltage terminal VP through the reset transistor RX.

The selection control signal SLS and the overflow control signal OS2 transit to the high level at a time point T10. As the overflow control signal OS2 transits to the high level, charges of the photo diode PD2 are discharged to the pixel voltage terminal VP. As a result, the charges of the photo diode PD2 do not overflow into the storage diode SD2.

In some embodiments, the overflow control signal OS2 may transit to the high level not at the time point T10, but instead at a time point between the time points T4' and T10. In further embodiments, the overflow control signal OS2 may transit to the high level in a random period of the integration time Tint2 at the high intensity of light incident on the pixel 650 (i.e., at the white level).

The reset control signal RS transits to the low level at a time point T11. Sampling of a reset signal is performed a time point Trs2.

The transfer control signal TS2 transits to the high level at a time point T12. Accordingly, charges stored in the storage diode SD2 are stored in the floating diffusion FD2. Sampling of an image signal is performed at a time point Tss2.

When the selection control signal SLS transits to the low level at a time point T13, a sampling operation on the floating diffusion FD2 is completed.

The floating diffusions FD1 and FD2 are separately described in order to describe the sampling operation on different photo diodes PD1 and PD2, but the floating diffusions FD1 and FD2 substantially form one node since they are electrically connected with each other as described with reference to FIG. 9.

Figure 12:
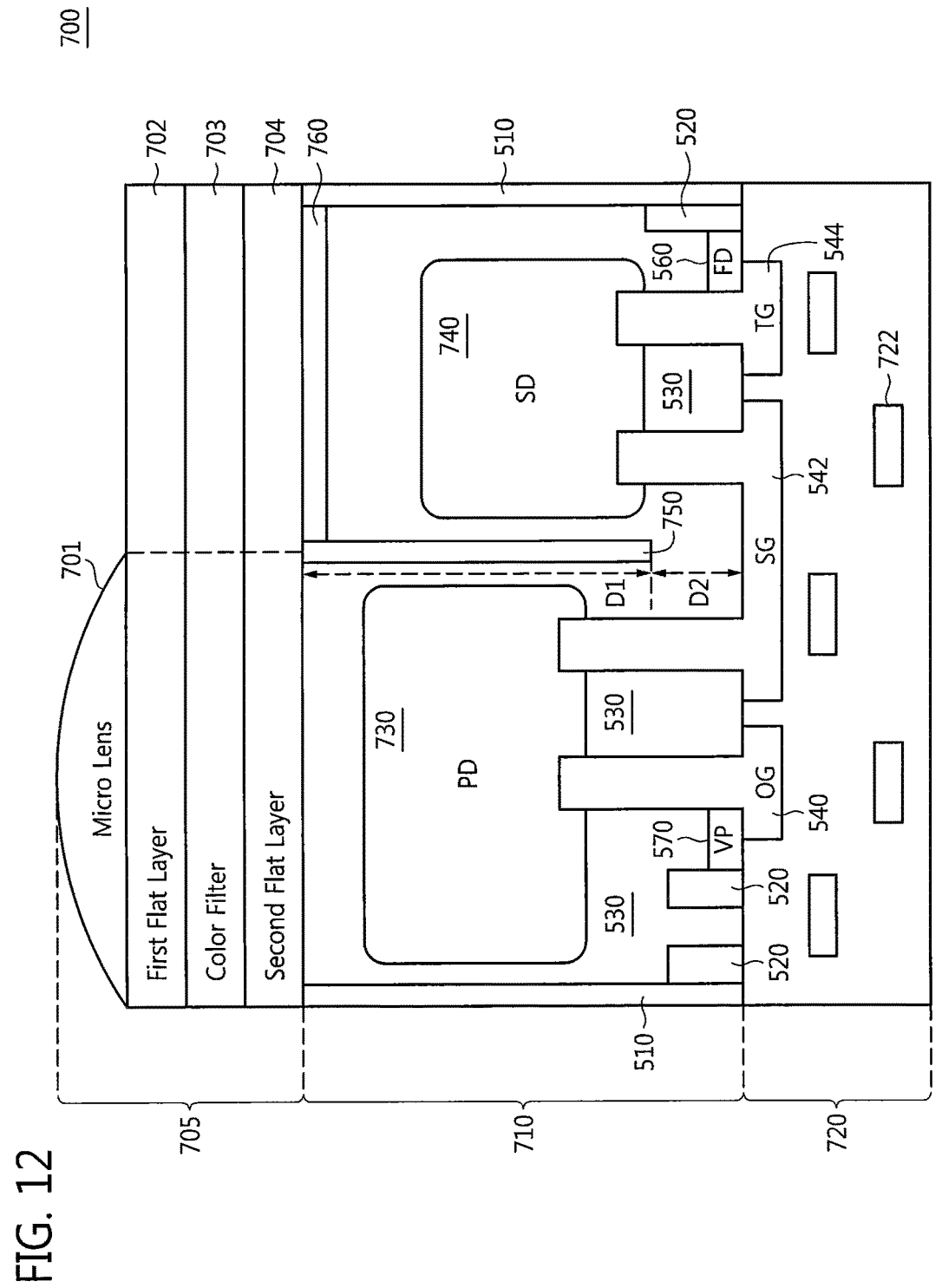
FIG. 12 is a cross-sectional view of the layout illustrated in FIG. 6 or 9.

FIG. 12 is a cross-sectional view of the layout 500 or 600 illustrated in FIG. 6 or 9. Referring to FIGS. 1 through 12, a pixel 700 illustrated in FIG. 12 is an example of a cross-section taken along the line A-A' illustrated in FIG. 6. The cross section taken along the line A-A' is substantially the same as a cross section taken along the line B-B' or C-C' illustrated in FIG. 9 except for some reference numerals (e.g., 520, 520-1, and 520-2). Thus, FIG. 12 illustrates only the cross section taken along the line A-A' illustrated in FIG. 6 for convenience' sake in the description. The pixel 700 may include an incidence layer 705, a semiconductor substrate 710, and a wiring layer 720.

The incidence layer 705 may include a micro lens 701, a first flat layer 702, a color filter 703, and a second plat layer 704. The micro lens 701 may be formed at the top (which is assumed to be a position at which incident light first arrives) of the pixel 700 to correspond to a photo diode PD or 730. The micro lens 701 may be used to increase a light gathering power and thus to increase image quality. The micro lens 701 may be the micro lens 450 illustrated in FIGS. 2 through 5.

The color filter 703 may be formed below the micro lens 701. The color filter 703 may selectively transmit light with a predetermined wavelength (e.g., red, green, blue magenta, yellow or cyan).

The first flat layer 702 and the second flat layer 704 may be respectively formed above and below the color filter 703 to prevent light coming through the micro lens 701 and the color filter 703 from being reflected. In other words, the first flat layer 702 and the second plat layer 704 transmit incident light efficiently, thereby increasing the performance (such as light absorptance and photosensitivity) of the image sensor 110.

The semiconductor substrate 710 may include the DTI region 510, the STI 520, the well area 530, the gate 540 of the overflow transistor OX, the gate 542 of the storage transistor SX, the gate 544 of the transfer transistor TX, the floating diffusion 560, the pixel voltage terminal 570, the photo diode 730, a storage diode 740, a second DTI 750, and a light shielding film 760. The elements 510, 520, 530, 540, 545, 544, 560, and 570 illustrated in FIG. 12 have been described with reference to FIG. 6. However, the gate 540 of the overflow transistor OX, the gate 542 of the storage transistor SX, and the gate 544 of the transfer transistor TX may be formed in a recess gate structure. The recess gate structure may be referred to as a vertical transfer gate structure.

The recess gate structure may be formed using a trench process. The trench process is a process of forming a trench in the semiconductor substrate 710 to a certain depth. The trench process may be divided into a DTI process providing a relatively deeper trench and an STI process providing a relatively shallower trench. The trench process may also be divided into a back trench process in which a trench is formed starting from the side of the incidence layer 705 and a front trench process in which a trench is formed starting from the side of the wiring layer 720. The recess gate structure may be formed using the front trench process.

The gates 540, 542, and 544 of the respective transistors OX, SX, and TX may be formed using the DTI or STI process according to the vertical depth of the photo diode 730 and the vertical depth of the storage diode 740.

When the gates 540, 542, and 544 of the respective transistors OX, SX, and TX are formed in the recess gate structure, the photo diode 730 and the storage diode 740 may not need to be formed close to a surface (i.e., the surface on which the elements 560 and 570 are formed) of the semiconductor substrate 710 but may be formed in the middle of the semiconductor substrate 710. In other words, the gates 540, 542, and 544 of the respective transistors OX, SX, and TX need to be close to the photo diode 730 or the storage diode 740 for the normal operation of the pixel 700. Therefore, when the gates 540, 542, and 544 of the respective transistors OX, SX, and TX are formed on the above-described surface of the semiconductor substrate 710, the photo diode 730 or the storage diode 740 should be formed in a narrow area corresponding to the gates 540, 542, and 544 of the respective transistors OX, SX, and TX. However, when the gates 540, 542, and 544 of the respective transistors OX, SX, and TX are buried in the semiconductor substrate 710, as shown in FIG. 12, the photo diode 730 or the storage diode 740 may be formed across the entire flat area of the photo diode area PA22 or the storage diode area SA22.

Accordingly, when the gates 540, 542, and 544 of the respective transistors OX, SX, and TX are formed in the recess gate structure, the maximum number of storable charges, i.e., full well capacity (FWC) and sensitivity of the photo diode 730 or the storage diode 740 are increased.

A gate insulation layer (not shown) may be formed between the gates 540, 542, and 544 of the respective transistors OX, SX, and TX and the semiconductor substrate 710. The gate insulation layer may be formed of $SiO_2$, SiON, SiN, $Al_2O_3$, $Si_3N_4$, $Ge_xO_yN_z$, $Ge_xSi_yO_z$, and/or a high-dielectric material. The high-dielectric material may be formed by performing atomic layer deposition using $HfO_2$, ZrO2, Al2O3, Ta2O5, hafnium silicate, zirconium silicate, and/or a combination thereof.

The photo diode 730 and the storage diode 740 may be the photo diode PD and the storage diode SD illustrated in FIG. 7. Each of the photo diode 730 and the storage diode 740 may be formed as an n- or p-type region in the well area 530 using ion implantation. It is assumed that the well area 530 is a p-type and the photo diode 730 and the storage diode 740 are an n-type, for convenience in description.

In some embodiments, the photo diode 730 and the storage diode 740 may be formed by stacking a plurality of doped regions. In this case, a lower doped region may be formed using implantation of n+ ions and an upper doped region may be formed using implantation of n− ions.

The storage diode 740 may be formed to a different thickness than the photo diode 730 so that photocharges stored in the storage diode 740 can be easily transferred to the floating diffusion 560. The photo diode 730 may be formed across most of the photo diode area PA22 except for the DTI region 510 and the second DTI 750 to obtain a high fill factor. The fill factor may be defined by a ratio of a light receiving area to a pixel area. The higher the fill factor, the higher the light absorptance. The DTI region 510 may be referred to as a first DTI.

The second DTI 750 may be formed between the photo diode 730 and the storage diode 740. The second DTI 750 may have a first length D1 that covers the vertical area of the photo diode 730 and the storage diode 740. The inside of the second DTI 750 may be formed of substantially the same material as the DTI region 510 using the back trench process.

In other words, the second DTI 750 may prevent electrical crosstalk and optical crosstalk between the photo diode 730 and the storage diode 740. In particular, the second DTI 750 may block incident light passing through the photo diode area PA22, thereby preventing the storage diode 740 from storing charges other than those transferred from the photo diode 730.

The second DTI 750 may be separated by a second length D2 from the surface of the semiconductor substrate 710. The second length D2 may be a minimum length to form a channel for charge transfer between the photo diode 730 and the storage diode 740.

The light shielding film 760 is formed on or above the storage diode 740 to have an area corresponding to the storage diode 740. The light shielding film 760 may block light incident through the incidence layer 705. The light shielding film 760 may be formed of tungsten, but the inventive concept is not restricted to this example.

The DTI region 510, the second DTI 750, and the light shielding film 760 may be form a light shielding unit that blocks light incident on the storage diode SD. In other words, these structures may minimize light leakage.

For instance, it is assumed that the storage diodes SD1 and SD2 store the same amount of photocharges at the time point T4 illustrated in FIG. 11. Since the storage diodes SD1 and SD2 are in different rows, photocharges transferred from the storage diodes SD1 and SD2 are sampled at different times, i.e., at the time points Tss1 and Tss2, respectively. Accordingly, when the light shielding unit does not exist, a signal sampled at the time point Tss1 may be different from a signal sampled at the time point Tss2 due to light leakage. The light shielding unit minimizes the light leakage, thereby preventing noise to occur due to different sampling timings.

The wiring layer 720 may include part of the gates 540, 542, and 544 of the respective transistors OX, SX, and TX and multi-layer conductive lines 722. The multi-layer conductive lines 722 may transmit the control signals OS, SS, TS, RS, and SLS applied to the transistors OX, SX, TX, RX, and SEL or may transmit a signal between the pixel 700 and the outside. The multi-layer conductive lines 722 may be formed by patterning a conductive material including metal such as copper or aluminum.

As shown in FIG. 12, the pixel 700 may be formed as a backside illumination (BSI) pixel in which the multi-layer conductive lines 722 are positioned at an opposite side of the semiconductor substrate 710 to face the incidence layer 705. However, the inventive concept is not restricted to the current embodiments.

Figure 13:
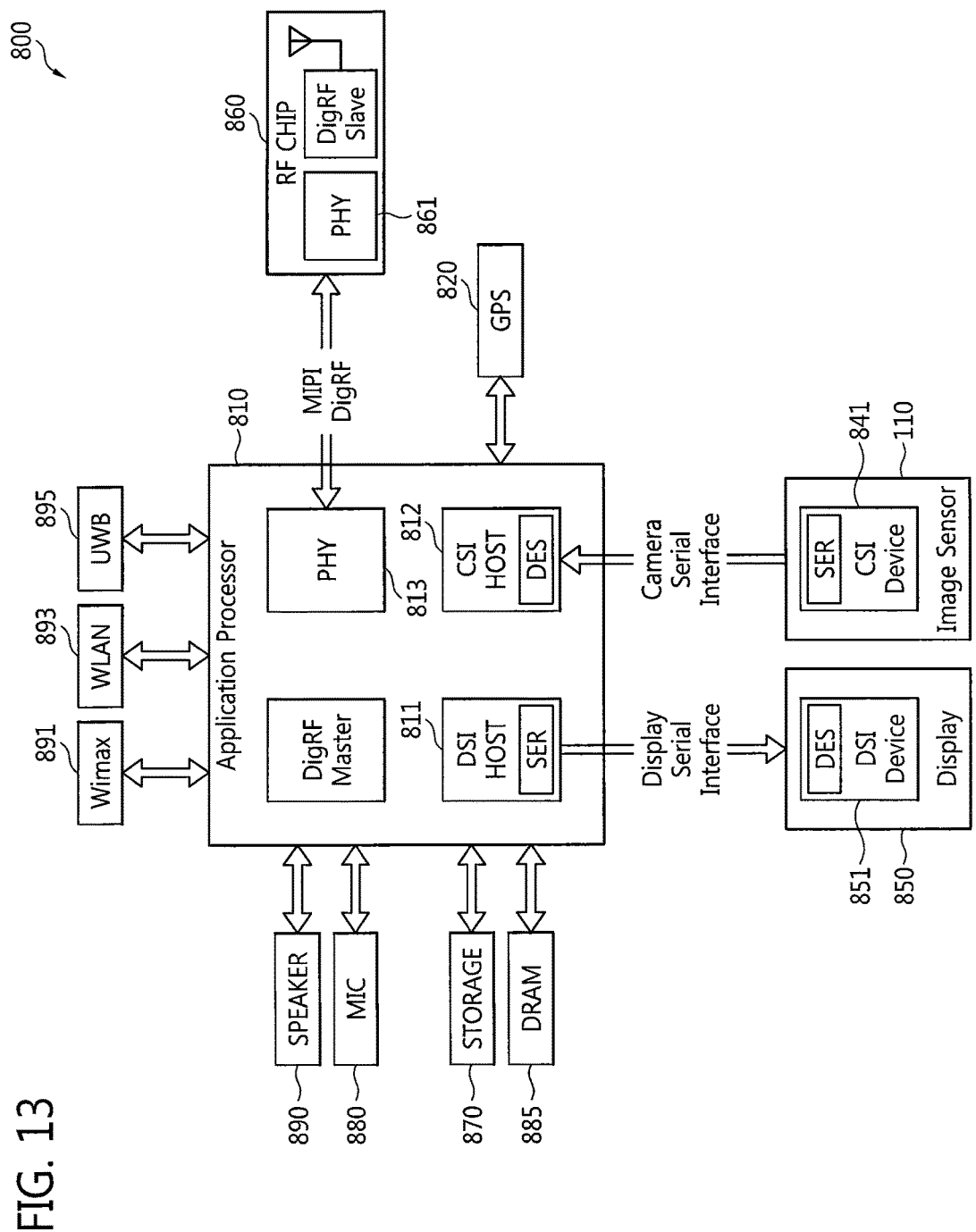
FIG. 13 is a block diagram of an electronic system including an image sensor according to some embodiments of the inventive concept.

FIG. 13 is a block diagram of an electronic system including an image sensor according to some embodiments of the inventive concept. The electronic system 800 may be implemented by a data processing apparatus, such as a mobile phone, a personal digital assistant (PDA), a portable media player (PMP), an IP TV, or a smart phone that can use or support the MIPI interface. The electronic system 800 includes an image sensor 110, an application processor 810, and a display 850.

A camera serial interface (CSI) host 812 included in the application processor 810 performs serial communication with a CSI device 841 included in the image sensor 110 through CSI. For example, an optical de-serializer (DES) may be implemented in the CSI host 812, and an optical serializer (SER) may be implemented in the CSI device 841.

A display serial interface (DSI) host 811 included in the application processor 810 performs serial communication with a DSI device 851 included in the display 850 through DSI. For example, an optical serializer may be implemented in the DSI host 811, and an optical de-serializer may be implemented in the DSI device 851.

The electronic system 800 may also include a radio frequency (RF) chip 860 which communicates with the application processor 810. A physical channel (PHY) 813 of the electronic system 800 and a PHY of the RF chip 860 communicate data with each other according to a MIPI DigRF standard. The electronic system 800 may further include at least one element among a GPS 820, a storage device 870, a microphone 880, a DRAM 885 and a speaker 890. The electronic system 800 may communicate using Wimax (World Interoperability for Microwave Access) 891, WLAN (Wireless LAN) 893 or UWB (Ultra Wideband) 895 etc.

Figure 14:
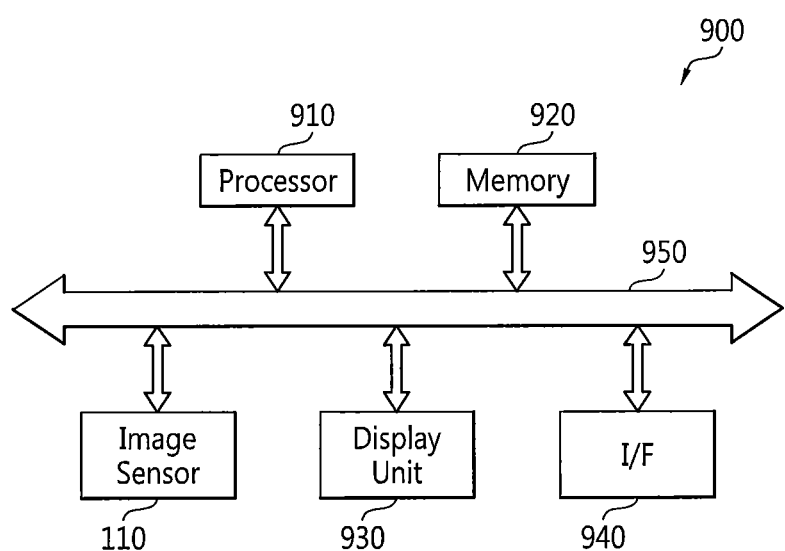
FIG. 14 is a block diagram of an electronic system including the image sensor according to some embodiments of the inventive concept.

FIG. 14 is a block diagram of an electronic system 900 including the image sensor 110 according to some embodiments of the inventive concept. Referring to FIG. 14, the electronic system 900 may include the image sensor 110, a processor 910, a memory 920, a display unit 930, and an I/F 940. In some embodiments, each of the image sensor 110, the processor 910, the memory 920, the display unit 930, and the I/F 940 may be communicatively coupled to one another via a bus 950.

The processor 910 may control the operation of the image sensor 110. The processor 910 may process pixel signals output from the image sensor 110 and generate image data.

The memory 920 may store a program for controlling the operation of the image sensor 110 and may also store the image data generated by the processor 910. The processor 910 may access the memory 920 and execute the program. The memory 920 may be formed as a volatile memory or a non-volatile memory.

The display unit 930 may receive the image data from the processor 910 or the memory 920 and display the image data on a display. For example, the display unit 930 may be a liquid crystal display (LCD), a light emitting diode (LED)

display, an organic light emitting diode (OLED) display, an active-matrix organic light emitting diode (AMOLED) and/or a flexible display.

The I/F 940 may be formed for the input and output of the image data. The I/F 940 may be implemented as a wireless I/F.

The present general inventive concept can also be embodied as computer-readable codes on a computer-readable medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices.

The computer-readable recording medium can also be distributed over network coupled computer systems so that the computer-readable code is stored and executed in a distributed fashion. Also, functional programs, codes, and code segments to accomplish the present general inventive concept can be easily construed by programmers.

As described above, according to some embodiments of the inventive concept, a micro lens is formed in a unit pixel to correspond to only a photo diode area, thereby increasing light absorptance and reducing light leakage in an image sensor and an image processing system. In addition, gates of transistors are formed in a recess gate structure and a photo diode or a storage diode is not formed on a surface of a semiconductor substrate, thereby increasing FWC and sensitivity. Moreover, a photo diode, a storage diode, and a floating diffusion are sequentially arranged in a line, so that transfer efficiency of photocharges among the elements is increased. Furthermore, a light shielding unit is formed around the storage diode, thereby minimizing light leakage.

While the inventive concept has been particularly shown and described with reference to example embodiments thereof, it will be understood by those of ordinary skill in the art that various changes in forms and details may be made therein without departing from the spirit and scope of the inventive concept as defined by the following claims.

What is claimed is:

1. A unit pixel of an image sensor which operates in global shutter mode, the unit pixel comprising:
    a photo diode area comprising a photo diode that is covered by a micro lens and that is configured to accumulate photocharges generated from incident light focused by the micro lens; and
    a storage diode area adjoining the photo diode area and comprising a storage diode that is not covered by the micro lens and that is configured to receive and store the photocharges that have been accumulated in the photo diode.

2. The unit pixel of claim 1, wherein the micro lens is one of an array of micro lenses, wherein the storage diode area is offset from the photo diode area along a direction aslant with respect to either of a row direction and a column direction of the array of micro lenses.

3. The unit pixel of claim 1, further comprising:
    an overflow gate that is configured to prevent photocharges from overflowing from the photo diode into the storage diode;
    a storage gate that is configured to transfer the photocharges accumulated at the photo diode to the storage diode; and
    a transfer gate that is configured to transfer the photocharges stored in the storage diode to a floating diffusion.

4. The unit pixel of claim 3, wherein the overflow gate, the storage gate, the transfer gate, and the floating diffusion are arranged in a line.

5. The unit pixel of claim 3, wherein a voltage level of the floating diffusion is sensed by an adjacent unit pixel.

6. The unit pixel of claim 3, wherein the overflow gate, the storage gate, and the transfer gate have a recess gate structure.

7. The unit pixel of claim 1, further comprising a light shielding film which has an area corresponding to the storage diode area to block the incident light.

8. The unit pixel of claim 1, further comprising a second deep trench isolation (DTI) between the photo diode and the storage diode to block the incident light.

9. The unit pixel of claim 1, further comprising a first deep trench isolation (DTI) at an edge of the unit pixel that is configured to provide electrical and optical isolation between the unit pixel and an adjacent unit pixel.

10. The unit pixel of claim 1, wherein the unit pixel shares a signal output circuit with an adjacent unit pixel, and
    wherein the signal output circuit comprises:
    a reset transistor that is configured to reset a floating diffusion to which the photocharges that have been accumulated in the photo diode are transferred;
    a source follower that is configured to generate a current corresponding to a voltage level of the floating diffusion; and
    a select transistor that is configured to output the current as a pixel signal.

11. An image sensor that operates in global shutter mode, the image sensor comprising:
    a pixel array comprising a plurality of unit pixels, each of which outputs a pixel signal corresponding to incident light;
    a readout circuit that is configured to perform analog-to-digital conversion on the pixel signal to generate a digital pixel signal; and
    a timing generator that is configured to control the pixel array and the readout circuit,
    wherein each of the unit pixels comprises:
    a photo diode area comprising a photo diode that is covered by a micro lens and configured to accumulate photocharges generated from the incident light; and
    a storage diode area adjoining the photo diode area and comprising a storage diode that is not covered by the micro lens and that is configured to receive and store the photocharges that have been accumulated in the photo diode.

12. The image sensor of claim 11, wherein the micro lens is one of an array of micro lenses, wherein the storage diode area is offset from the photo diode area along a direction that is aslant with respect to either of a row direction and a column direction of the array of micro lenses.

13. The image sensor of claim 11, wherein each of the unit pixels further comprises:
    an overflow gate that is configured to prevent photocharges from overflowing from the photo diode into the storage diode;
    a storage gate that is configured to transfer the photocharges accumulated at the photo diode to the storage diode; and
    a transfer gate that is configured to transfer the photocharges stored in the storage diode to a floating diffusion.

14. The image sensor of claim 13, wherein the overflow gate, the storage gate, the transfer gate, and the floating diffusion are arranged in a line.

15. An image sensor comprising:
a pixel array comprising a plurality of unit pixels, each of the unit pixels comprising:
- a photo diode that is configured to accumulate photocharges generated from incident light;
- a storage diode that is configured to receive and store the photocharges that have been accumulated in the photo diode; and
- a floating diffusion that is configured to receive photocharges that are stored in the storage diode; and a plurality of micro lenses arranged in rows and columns, respective ones of the micro lenses covering and focusing the incident light on respective ones of the photo diodes, with respective ones of the storage diodes being disposed at respective gaps between four adjacent ones of the micro lenses.

16. The image sensor of claim 15, wherein each of the plurality of unit pixels comprises:
- an overflow gate that is configured to prevent photocharges from overflowing from the photo diode into the storage diode;
- a storage gate that is configured to transfer the photocharges accumulated at the photo diode to the storage diode; and
- a transfer gate that is configured to transfer the photocharges stored in the storage diode to the floating diffusion.

17. The image sensor of claim 16, wherein the overflow gate, the storage gate, the transfer gate, and the floating diffusion are arranged in a line.

18. The image sensor of claim 16, wherein a voltage level of the floating diffusion is sensed by an adjacent one of the plurality of unit pixels.

19. The image sensor of claim 15, wherein each of the plurality of unit pixels comprises:
- a first deep trench isolation (DTI) at an edge of the unit pixel that is configured to provide electrical and optical isolation between the unit pixel and an adjacent one of the plurality of unit pixels; and
- a second deep trench isolation (DTI) between the photo diode and the storage diode to block the incident light.

20. The image sensor of claim 15, wherein ones of the plurality of unit pixels share a signal output circuit with adjacent ones of the plurality of unit pixels, and
wherein the signal output circuit comprises:
- a reset transistor that is configured to reset a floating diffusion to which the photocharges that have been accumulated in the photo diode are transferred;
- a source follower that is configured to generate a current corresponding to a voltage level of the floating diffusion; and
- a select transistor that is configured to output the current as a pixel signal.

* * * * *